(12) United States Patent
Savary et al.

(10) Patent No.: US 10,211,840 B2
(45) Date of Patent: Feb. 19, 2019

(54) CHARGE PUMP DRIVER CIRCUIT

(71) Applicant: NXP USA, Inc., Austin, TX (US)

(72) Inventors: Pierre Pascal Savary, Fonsorbes (FR); Dominique Delbecq, Fonsorbes (FR); Birama Goumballa, Larra (FR)

(73) Assignee: NXP USA, Inc., Austin, TX (US)

( * ) Notice: Subject to any disclaimer, the term of this patent is extended or adjusted under 35 U.S.C. 154(b) by 147 days.

(21) Appl. No.: 15/410,890

(22) Filed: Jan. 20, 2017

(65) Prior Publication Data

US 2018/0013436 A1 Jan. 11, 2018

(30) Foreign Application Priority Data

Jul. 7, 2016 (EP) ..................................... 16305854

(51) Int. Cl.
*H03L 7/089* (2006.01)
*H03L 7/183* (2006.01)

(52) U.S. Cl.
CPC .......... *H03L 7/0896* (2013.01); *H03L 7/0895* (2013.01); *H03L 7/0898* (2013.01); *H03L 7/183* (2013.01)

(58) Field of Classification Search
CPC ...... H03K 17/10; H03K 17/102; H03K 17/12; H03K 17/122; H03K 17/16; H03K 17/161; H03K 17/30; H03K 17/302; H03K 19/003; H03K 19/00307; H03K 19/00315; H03K 19/00346; H03K 19/00353; H03K 19/00361; H04L 25/026; G11C 5/145; H02M 3/07; H02M 3/073; H02M 2003/071; H02M 2003/072; H02M 2003/075–2003/078

USPC ................. 327/108–112, 156–158, 536, 537
See application file for complete search history.

(56) References Cited

U.S. PATENT DOCUMENTS

| | | | |
|---|---|---|---|
| 6,265,946 B1 | 7/2001 | Bartlett | |
| 6,288,660 B1 | 9/2001 | Nisbet | |
| 7,567,105 B2 * | 7/2009 | Trichy | ................ G06F 13/4072 326/86 |

(Continued)

OTHER PUBLICATIONS

U.S. Appl. No. 14/707,179 Inventor Birama Goumballa, "Charge Pump Apparatus, Phase-Locked Loop, and Method of Operating a Charge Pump Apparatus", filed May 8, 2015.

(Continued)

*Primary Examiner* — Lincoln D Donovan
*Assistant Examiner* — Diana J. Cheng

(57) ABSTRACT

A charge pump driver circuit comprises an output stage and a current generator component. The output stage is arranged to receive at an input node thereof a control current signal and comprises a resistance network coupled between the input node thereof and a reference voltage node and arranged to provide a resistive path through which the control current signal flows. The output stage is arranged to generate at an output node thereof a charge pump control voltage signal based on the voltage level at the input node thereof. The current generator component is arranged to receive an indication of a voltage level of a charge pump output signal, and to generate a feedback current dependent on the voltage level of the output signal, wherein the feedback current is injected into the resistive path of the resistance network through which the control current signal flows.

19 Claims, 7 Drawing Sheets

(56) References Cited

U.S. PATENT DOCUMENTS

| | | |
|---|---|---|
| 8,022,739 B2 | 9/2011 | Yan |
| 2007/0090885 A1 | 4/2007 | Okazaki |
| 2009/0189654 A1 | 7/2009 | Clements et al. |

OTHER PUBLICATIONS

EP Application No. 16305668.2 Inventor Birama Goumballa, "Method and Apparatus for Generating a Charge Pump Control Signal", filed Jun. 8, 2016.

* cited by examiner

CHARGE PUMP DRIVER CIRCUIT

FIELD OF THE INVENTION

This invention relates to a charge pump driver circuit. In particular, this invention relates to a charge pump driver circuit arranged to output a charge pump control voltage signal for a charge pump within a phase-locked loop.

BACKGROUND OF THE INVENTION

Radar circuits often use a phase-locked loop (PLL) to generate a ramp modulated signal. In the case of a PLL with a charge pump, the charge pump is used to drive a control port of a voltage controlled oscillator (VCO). When fabricated by way of a BICMOS millimeter wave fabrication process, the voltage range of the varactor within the VCO can extend beyond the maximum voltage tolerated by the (high-speed) output bipolar transistor of the charge pump. Accordingly, in order to maximize the frequency coverage of the PLL, the output voltage of the charge pump must exceed the maximum voltage of the charge pump transistors.

FIG. 1 illustrates a simplified circuit diagram of a charge pump circuit 100. The charge pump circuit 100 consists of a pair of bipolar transistors 110, 120 having emitter terminals coupled to a pulse current source 130. A collector terminal of the first bipolar transistor 110 is coupled to a trickle current source 140 and to an output node 105 of the charge pump circuit 100. A collector terminal of the second bipolar transistor 120 is coupled to a supply rail 150. A first voltage control signal 115 is received at a base terminal of the first bipolar transistor 110, and is arranged to control the switching of the first bipolar transistor 110. A second voltage control signal 125 is received at a base terminal of the second bipolar transistor 120, and is arranged to control the switching of the second bipolar transistor 120.

In operation, the first voltage control signal 115 is generated to control the first bipolar transistor 110 such that when the first bipolar transistor 110 is 'off' the trickle current from the trickle current source 140 flows through the output node 105 of the charge pump circuit 100. Conversely, when the first bipolar transistor 110 is 'on', the current flowing to the output node 105 will equal the difference between the pulse current from the pulse current source 130 and the trickle current from the trickle current source 140.

The second voltage control signal 125 is generated to control the second bipolar transistor 120 to provide a current path for the pulse current from the pulse current source 130 when the first bipolar transistor 110 is off, in order to allow the pulse current source 130 to always be on. Accordingly, the first and second voltage control signals 115, 125 may be viewed as differential voltage signals arranged to control the first and second bipolar transistors 110, 120 in a differential manner.

The voltage signals 115, 125 received at the base terminals of the bipolar transistors 110, 120 are generated by way of respective first and second current signals 112, 122 injected into the voltage signal nodes and a resistance network 160 coupled between the voltage signal nodes and a reference voltage (e.g. ground).

In the case of a PLL fabricated by way of a BICMOS millimeter wave fabrication process, the full voltage range for driving the varactor within the VCO might be, for example, 0.4V to 4.5V. Accordingly, in order to maximize the frequency coverage of the PLL, the charge pump circuit 100 should be capable of generating an output voltage $V_{out}$ of a corresponding range: 0.4V to 4.5V. In particular, the charge pump circuit 100 should be able to generate a ramped output voltage signal whereby during the 'ramp up' phase the voltage at the output node 105 increases up to the maximum output voltage of 4.5V, whilst during 'the ramp down' phase the voltage at the output node 105 decreases down to the minimum output voltage of 0.4V. The voltage signal at the output node 105 is achieved by generating current pulses at the output node 105 that are converted into a voltage signal by a filter (not shown).

However, the BICMOS millimeter wave bipolar transistors 110, 120 are unable to tolerate voltage levels as high as 4.5V, and may be limited to voltage levels of, for example, 3.9V or less. Accordingly, in order to achieve the high-end output voltage level of 4.5V at the output node 105, the voltage at the emitter terminal of the first bipolar transistor 110 must be at least 0.6V in order to limit the voltage across the first bipolar transistor 110 to 3.9V. Such a high voltage level at the emitter terminal of the first bipolar transistor would result in a minimum achievable output voltage $V_{out}$ at the output node 105 of 0.8V.

SUMMARY OF THE INVENTION

The present invention provides a charge pump driver circuit, a phase-locked loop and a method of generating a charge pump control voltage signal as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

According to some example embodiments of the present invention, there is provided a charge pump driver circuit for generating a charge pump control voltage signal used for controlling a bipolar transistor within a charge pump circuit.

A feedback current is generated dependent on the voltage level of a charge pump output signal. The feedback current is injected into a resistive path used to convert a control current signal into the charge pump control voltage signal. By injecting such a feedback current into the resistive path, the voltage across the resistance network, and thus from which the charge pump control voltage signal is generated, is dependent on the feedback current, and thus dependent on the voltage level of the output signal.

As a result, and as described in greater detail below, the voltage at the emitter terminal of a bipolar transistor within the charge pump circuit may be scaled with the voltage level of the output signal to enable a large target output voltage range to be achieved at the output of the charge pump circuit, without the voltage across the bipolar transistor exceeding a maximum tolerated voltage.

Figure 1:
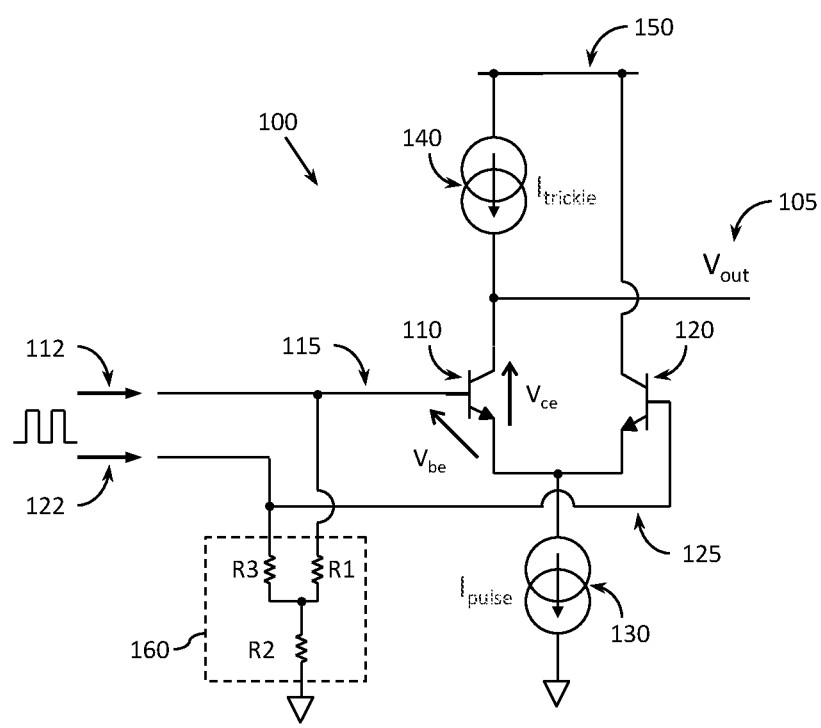
FIG. 1 illustrates a simplified circuit diagram of a charge pump circuit.
Figure 2:
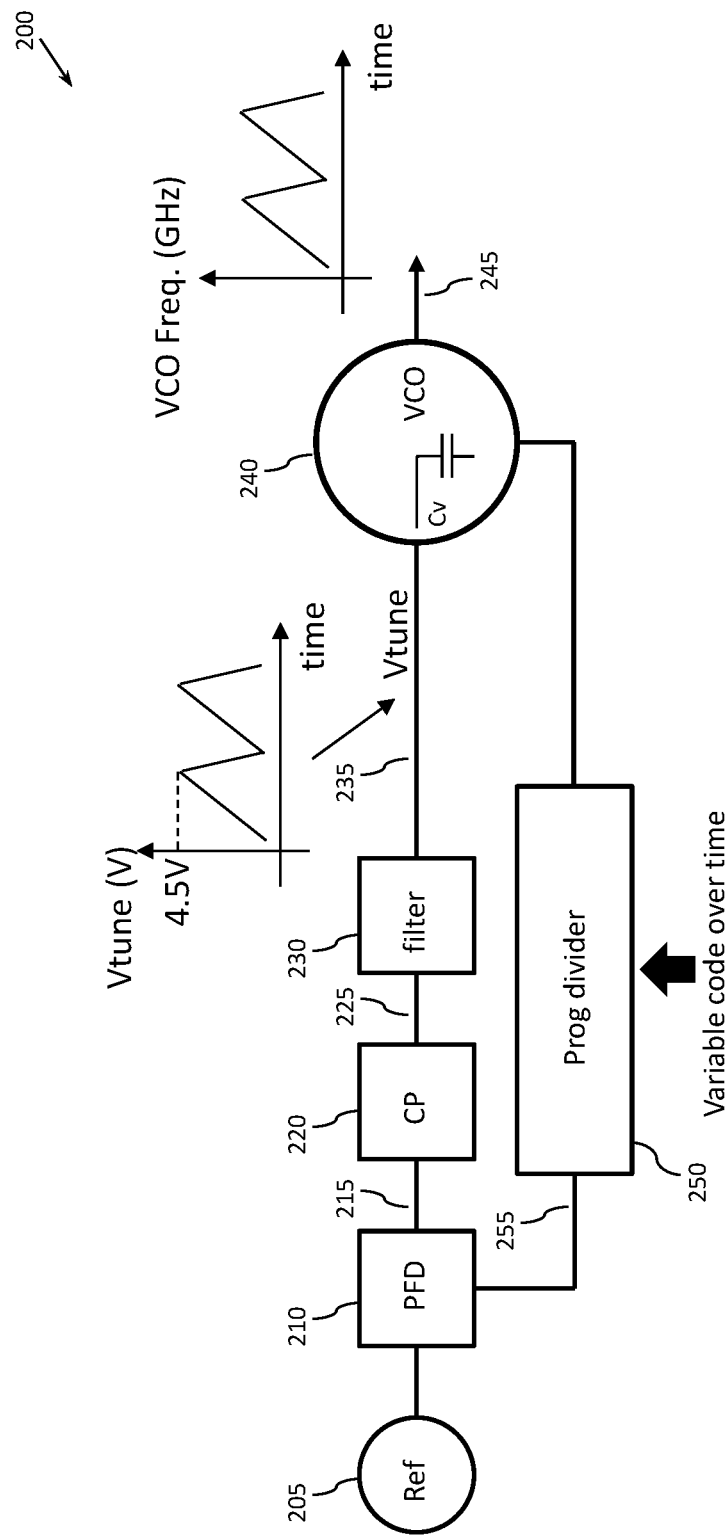
FIG. 2 illustrates a simplified block diagram of an example of a phase-locked loop.

Referring first to FIG. 2, there is illustrated a simplified block diagram of an example of a phase-locked loop (PLL) 200. The PLL 200 includes a phase detector 210, a charge pump module 220, a loop filter 230 and a voltage controlled oscillator (VCO) 240, all coupled in series. In response to a voltage signal 235 output by the loop filter 230 at its control port, the VCO 240 outputs an oscillating output signal 245 having an oscillation frequency dependent on the voltage signal 235. The output signal 245 is fed back to the phase detector 210 as a feedback signal 255 via a feedback path. In the illustrated example, a programmable divider 250 is provided within the feedback path and arranged to receive the output signal 245, divide the frequency of the output signal 245 by a programmed amount and output the divided frequency signal as the feedback signal 255.

The phase detector 210 compares the phase of the feedback signal 255 to the phase of a reference signal 205, and outputs a charge pump control signal 215 to the charge pump module 220. The charge pump control signal 215 generated by the phase detector 210 typically consists of voltage pulses in response to detecting phase differences between the feedback signal 255 and the reference signal 205. In particular for some examples, the phase detector 210 is arranged to generate a pulse-width modulated charge pump control signal 215 having a pulse width dependent on the phase difference between the feedback signal 255 and the phase of a reference signal 205.

The charge pump module 220 responds to voltage pulses received from the phase detector 210 by outputting a signal 225 consisting of current pulses to the loop filter 230. The loop filter 230 'averages' the current pulses to generate a DC (continuous) voltage signal 235 at the control port of the VCO 240.

Figure 3:
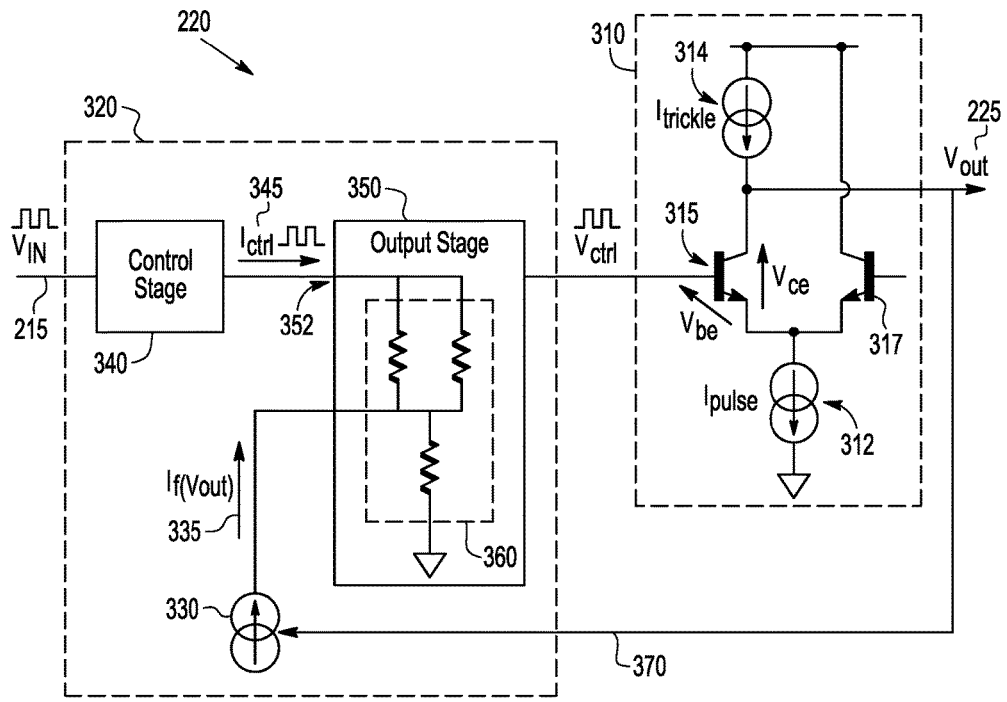
FIG. 3 illustrates a simplified block diagram of an example of a charge pump module within the phase-locked loop of FIG. 2.

Referring now to FIG. 3, there is illustrated a simplified block diagram of an example of the charge pump module 220 within the PLL of FIG. 2. The charge pump module 220 consists of a charge pump circuit 310 arranged to generate the output signal 225 used to drive the control port of the VCO 240. The charge pump module 220 further includes a charge pump driver circuit 320 arranged to output a charge pump control voltage signal 325 to the charge pump circuit 310.

The charge pump driver circuit 320 includes a control stage 340 arranged to receive as an input signal the charge pump control signal 215 and to generate a control current signal 345 in accordance with the input signal 215. The charge pump driver circuit 320 further includes an output stage 350 arranged to receive at an input node 352 thereof the control current signal 345 output by the control stage 340 and to generate the charge pump control voltage signal 325 based on the control current signal 345 output by the control stage 340. In particular, the output stage 350 includes a resistance network 360 coupled between the input node 352 and a reference voltage node (e.g. ground), and arranged to provide a resistive path through which the control current signal 345 flows. In this manner, the resistance network 360 is arranged to convert the control current signal 345 into a voltage signal at the input node 352 of the output stage 350, and the output stage 350 is arranged to generate the charge pump control voltage signal 325 based on the voltage level at the input node 352 thereof.

Figure 4:
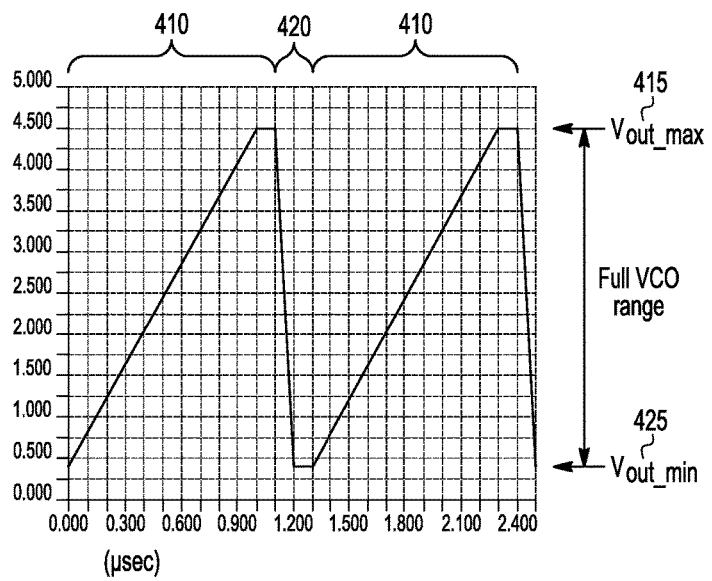
FIG. 4 illustrates a simplified graph showing an example of voltage over time for the output signal of the charge pump circuit of FIG. 3.

FIG. 4 illustrates a simplified graph showing an example of voltage over time for the output signal 225 of the charge pump circuit 310 used to drive the control port of the VCO 240. During 'ramp up' phases 410, the charge pump control signal 215 causes the charge pump circuit 320 to drive the voltage of the output signal 225 up until it reaches a maximum voltage level ($V_{out\_max}$) 415. Conversely, during 'ramp down' phases 420, the charge pump control signal 215 causes the charge pump module 220 to drive the voltage of the output signal 225 down until it reaches a minimum voltage level ($V_{out\_min}$) 425.

As illustrated in FIG. 4, the up and down voltage ramps may have different gradient slopes. The output voltage signal 225 is achieved by generating current pulses at the output node of the charge pump that are converted in to a voltage signal by the filter 230 (FIG. 2).

In the case of a PLL fabricated by way of a BICMOS millimeter wave fabrication process, the full voltage range for driving the varactor within the VCO 240 (FIG. 2) might be, for example, 0.4V to 4.5V. Accordingly, in order to maximize the frequency coverage of the PLL 200, the charge pump should be capable of an output voltage range of 0.4V to 4.5V.

For the charge pump circuit 310 illustrated in FIG. 3, assuming a voltage across the pulse current source 312 of 0.2V to achieve the minimum voltage level ($V_{out\_min}$) 425 of 0.4V at the output of the charge pump circuit 310, the voltage across the bipolar transistor 315 required to achieve the maximum voltage level ($V_{out\_max}$) 415 of 4.5V would be 4.3V, in excess of the maximum voltage of 3.9V that the bipolar transistor 315 is able to tolerate. Conversely, assuming a voltage across the pulse current source 312 of 0.6V to achieve the maximum voltage level ($V_{out\_min}$) 415 of 4.5V at the output of the charge pump circuit 310 without exceeding the maximum tolerable voltage of 3.9V across the bipolar transistor 315, the minimum achievable voltage at the output of the charge pump circuit 310 is limited to 0.8V, greater than the target minimum voltage level ($V_{out\_min}$) 425 of 0.4V. Accordingly, in order to enable the target output voltage range of 0.4V to 4.5V to be achieved at the output of the charge pump circuit 310, it is proposed to implement some form of voltage scaling within the charge pump module 310 whereby, for example, a voltage of less than or equal to 0.4V across the pulse current source 312 is realised when the voltage at the output of the charge pump circuit 310 is equal to the target minimum voltage level ($V_{out\_min}$) 425 of 0.4V, and a voltage of greater than or equal to 0.6V across the pulse current source 312 is realised when the voltage at the output of the charge pump circuit 310 is equal to the target maximum voltage level ($V_{out\_max}$) 415 of 4.5V.

The voltage $V_e$ at the emitter terminal of the bipolar transistor 315 may be expressed as:

$$V_e = V_b - V_{be} \quad \text{Equation 1}$$

The voltage $V_{be}$ across the base and emitter terminals of a bipolar transistor is constant (under fixed conditions, e.g. temperature, current, etc.). Accordingly, the voltage $V_e$ at the emitter terminal of the bipolar transistor 315, and thus across the pulse current source 312, may be controlled using the voltage $V_b$ at the base terminal of the bipolar transistor 315; i.e. by controlling the voltage level of the charge pump control voltage signal 325.

As described above, the resistance network 360 of the output stage 350 of the charge pump driver circuit 320 is arranged to convert the control current signal 345 into a voltage signal at the input node 352 of the output stage 350, and the output stage 350 is arranged to generate the charge pump control voltage signal 325 based on the voltage level at the input node 352 thereof. In the example illustrated in FIG. 3, the charge pump driver circuit 320 further includes a current generator component 330 arranged to receive an indication 370 of the voltage level of the output signal 225 used to drive the control port of the VCO 240, and to generate a feedback current 335 dependent on the voltage level of the output signal 225. The feedback current 335 is injected into the resistive path of the resistance network 360 through which the control current signal 345 flows.

In this manner, the voltage across the resistance network 360, and thus of the charge pump control voltage signal 325 received at the base terminal of the bipolar transistor 315 of the charge pump circuit 310, is further dependent on the feedback current $I_{f(Vout)}$ 335, and thus dependent on the voltage level of the output signal 225 used to drive the control port of the VCO 240. Advantageously, by making the voltage level of the charge pump control voltage signal 325 received at the base terminal of the bipolar transistor 315 of the charge pump circuit 310 dependent on the voltage level of the output signal 225 used to drive the control port of the VCO 240, the voltage at the emitter terminal of the bipolar transistor 315 may be scaled with the voltage level of the output signal 225 to enable the target output voltage range of 0.4V to 4.5V to be achieved at the output of the charge pump circuit 310, without the voltage $V_{ce}$ across the bipolar transistor 315 exceeding the maximum tolerated voltage of 3.9V.

Figure 5:
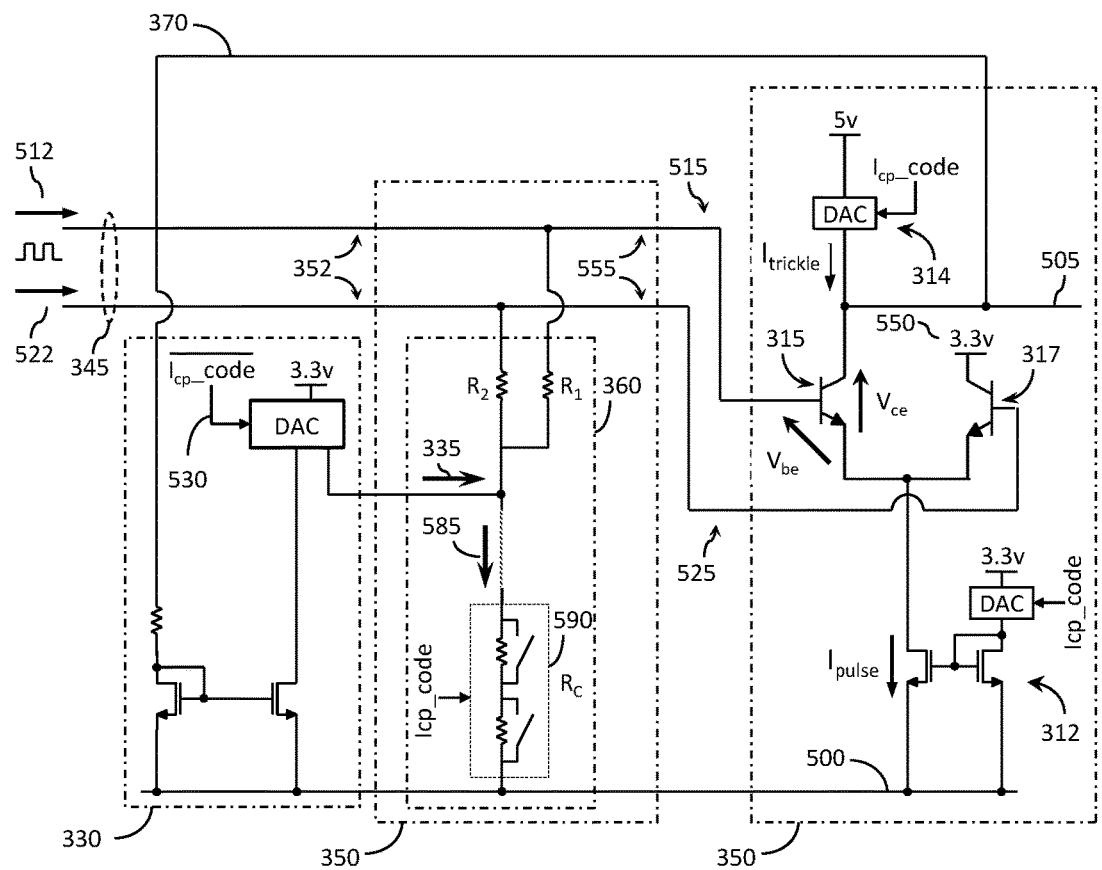
FIG. 5 illustrates a simplified circuit diagram of an example of the charge pump module of FIGS. 2 and 3.

FIG. 5 illustrates a simplified circuit diagram of an example of the charge pump module 220 of FIGS. 2 and 3, and in particular of the current generator component 330 and the output stage 350 of the charge pump driver circuit 320, and the charge pump circuit 310. The charge pump circuit 310 consists of a pair of bipolar transistors 315, 317 having emitter terminals coupled to the pulse current source 312. A collector terminal of the first bipolar transistor 315 is coupled to the trickle current source 314 and to an output node 505 of the charge pump circuit 310. A collector terminal of the second bipolar transistor 317 is coupled to a supply rail 550, which for the illustrated example consists of a 3.3V supply rail.

A first voltage control signal 515 is received at a base terminal of the first bipolar transistor 315 of the charge pump circuit 310, and is arranged to control the switching of the first bipolar transistor 315. A second voltage control signal 525 is received at a base terminal of the second bipolar transistor 317 of the charge pump circuit 310, and is arranged to control the switching of the second bipolar transistor 317.

In operation, the first voltage control signal 515 is generated to control the first bipolar transistor 315 such that when the first bipolar transistor 315 is 'off' the trickle current from the trickle current source 314 flows through the output node 505 of the charge pump circuit 310. Conversely, when the first bipolar transistor 315 is 'on', the current flowing to the output node 505 will equal the difference between the pulse current from the pulse current source 312 and the trickle current from the trickle current source 314.

The second voltage control signal 525 is generated to control the second bipolar transistor 317 to provide a current path for the pulse current from the pulse current source 312 when the first bipolar transistor 315 is off, in order to allow the pulse current source 312 to constantly be on. Accordingly, the first and second voltage control signals 515, 525 may be viewed as differential voltage signals arranged to control the first and second bipolar transistors 315, 317 in a differential manner.

The output stage 350 of the charge pump driver circuit 320 is arranged to receive the control current signal 345 from the control stage 340. In the example illustrated in FIG. 5 the control current signal 345 consists of differential, pulse width modulated current signals 512, 522.

The output stage 350 is arranged to generate the voltage signals 515, 525 at output nodes 555 thereof by way of the resistance network 360 coupled between the input nodes 352 of the output stage 350 and a reference voltage node, which in the illustrated example consists of a ground node 500. Accordingly the first voltage control signal 515 at the base terminal of the first bipolar transistor 315 is dependent on the respective current signal 512 and the resistive path provided by the resistance network 360 through which the current signal 512 flows. Similarly, the second voltage signal 525 at the base terminal of the second bipolar transistor 317 is dependent on the respective current signal 522 and the resistive path provided by the resistance network 360 through which the current signal 522 flows.

In the examples illustrated in FIGS. 3 and 5, the charge pump driver circuit 320 further includes a current generator component 330 arranged to receive an indication 370 of the voltage level of the output signal 225 (FIG. 2) at the output node 505 of the charge pump circuit 310 used to drive the control port of the VCO 240, and to generate a feedback current 335 dependent on the voltage level of the output signal 225. The feedback current 335 is injected into the resistive paths of the resistance network 360 through which the current signals 512, 522 flow. In this manner, the voltage across the resistance network 360, and thus at the input nodes 352 of the output stage 350, is further dependent on the feedback current 335, and thus dependent on the voltage level of the output signal 225 used to drive the control port of the VCO 240. For the illustrated examples, the current generator component 330 is arranged to generate the feedback current $I_{f(Vout)}$ 335 having a positive slope amplitude profile with respect to the voltage $V_{out}$ of the output signal 225. In this manner, the resulting voltage across the resistance network 360, and thus at the input nodes 352 of the output stage 350, will also have a positive slope profile with respect to the voltage $V_{out}$ of the output signal 225.

During a 'pulse' of the differential control current signal 345, when the first current component 512 of the differential control current signal 345 is 'on' and the second current component 514 is 'off' (i.e. substantially zero), the first voltage signal 515 ($V_1$) received at the base terminal of the first bipolar transistor 315 may be expressed as:

$$V_1 = R_1 * I_1 + R_c * I_c \qquad \text{Equation 2}$$

where $I_1$ represents the first current component 512 of the differential control current signal 345 (assuming that the base current of the bipolar transistor 315 is negligible) and $I_c$ represents the combined current 585 flowing through the common resistance element $R_c$ 590.

During the pulse cycle of the differential control current signal 345, when $I_1$ 512 is "on" $I_2$ 522 is "off" and vice versa.

Thus, the combined current $I_C$ 585 is the sum of the feedback current $I_{f(Vout)}$ 335 and either $I_1$ 512 or $I_2$ 522, depending on at what point of its pulse cycle the differential control current signal 345 is in. However, since $I_{1\_on}$ (the first current component I1 512 when $I_1$ is 'on') and $I_{2\_on}$ (the second current component $I_2$ 522 when $I_2$ is 'on') are substantially equal, and as both $I_1$ 512 and $I_2$ 522 go through the common resistance element $R_C$ 590, the current in the common resistance element $R_C$ 590 remains constant. Accordingly, Equation 2 may be re-written as:

$$V_1 = R_1 * I_{on} * R_c * (I_{on} + I_{f(Vout)})  \qquad \text{Equation 3}$$

where $I_{on} = I_{1\_on} = I_{2\_on}$. The voltage $V_{ce}$ across the first bipolar transistor 315 of the charge pump circuit 310 may be expressed as:

$$V_{ce} = V_{out} + V_{be} - V_b  \qquad \text{Equation 4}$$

Substituting in Equation 3 for the base voltage $V_b$ gives:

$$V_{ce} = V_{out} + V_{be} - (R_{on} * I_{on} + R_c * (I_{on} + I_{f(Vout)}))  \qquad \text{Equation 5}$$

Thus, from Equation 5 it can be seen that for a given output voltage, the voltage across the first bipolar transistor 315 of the charge pump circuit 310 may be dynamically controlled through the feedback current $I_{f(Vout)}$ 335.

Figure 6:
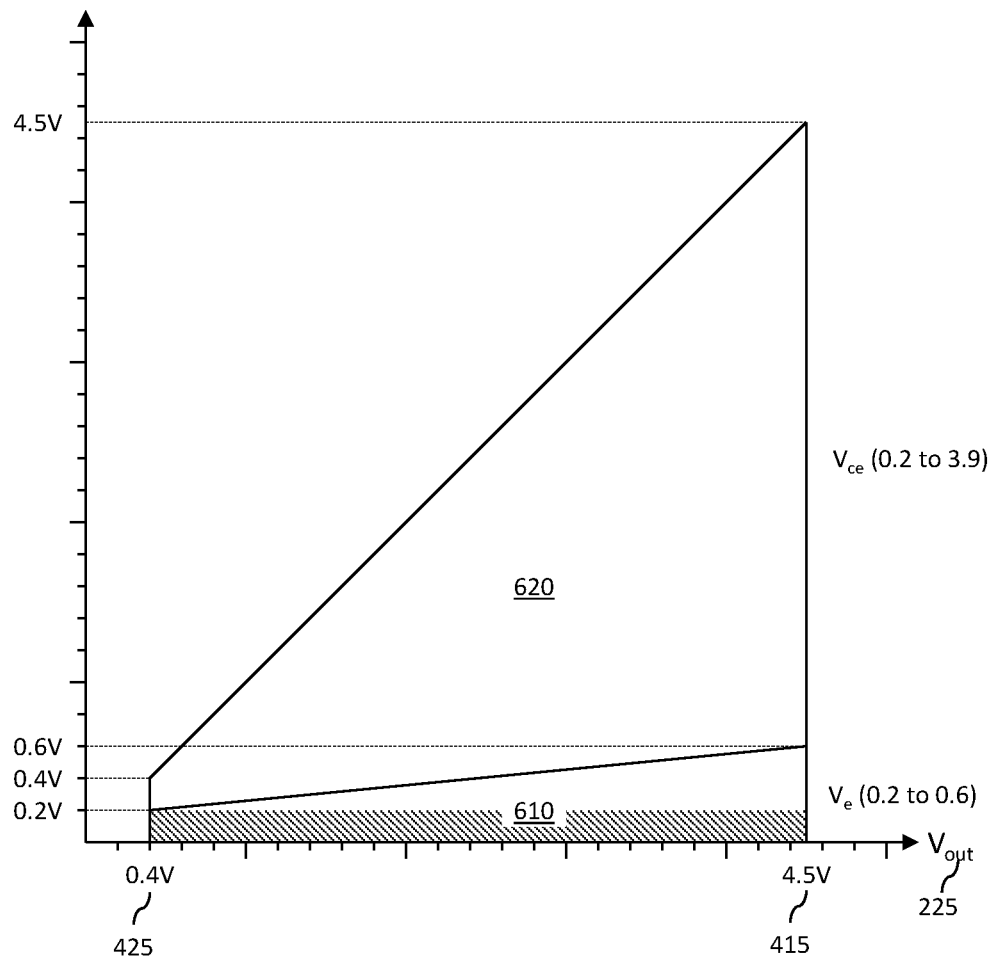
FIG. 6 illustrates a simplified graph showing an example of voltage levels within the charge pump circuit with respect to the output signal voltage.

FIG. 6 illustrates a simplified graph showing an example of voltage levels within the charge pump circuit 310 with respect to the output signal voltage $V_{out}$ 225. When the voltage $V_{out}$ of the output signal 225 is at a minimum voltage level ($V_{out\_min}$) 425, which in the illustrated example is 0.4V, the feedback current $I_{f(Vout)}$ 335 is generated such that the voltage $V_e$ at the common emitter node of the bipolar transistors 315, 317, represented by the first area 610 of the graph in FIG. 6, is at a first, minimum voltage level of, in the illustrated example, 0.2V, with a 0.2V collector-emitter voltage $V_{ce}$ across the first bipolar transistor 315 represented by the second area 620 of the graph in FIG. 6. Conversely, when the voltage $V_{out}$ of the output signal 225 is at a maximum voltage level ($V_{out\_max}$) 415, which in the illustrated example is 4.5V, the feedback current $I_{f(Vout)}$ 335 is generated such that the voltage $V_e$ 610 at the common emitter node of the bipolar transistors 315, 317 is at a second, maximum voltage level of, in the illustrated example, 0.6V, with a 3.9V collector-emitter voltage $V_{ce}$ 620 across the first bipolar transistor 315.

Thus, as can be seen from FIG. 5, the feedback current $I_{f(Vout)}$ 335 is adapted in response to the voltage $V_{out}$ of the output signal 225 such that voltage $V_e$ 610 at the common emitter node of the bipolar transistors 315, 317 is 'scaled' with the voltage $V_{out}$ of the output signal 225, enabling a full output voltage range from 0.4V to 4.5V to be achieved, without the collector-emitter voltage $V_{ce}$ 620 across the first bipolar transistor 315 exceeding a maximum tolerated voltage of, for example, 3.9V. Significantly, the full output voltage range from 0.4V to 4.5V is achievable in a single, uninterrupted and continuous 'sweep'. Furthermore, because the feedback current $I_{f(Vout)}$ 335 is automatically adapted in response to the voltage $V_{out}$ of the output signal 225, the voltage $V_e$ 610 at the common emitter node of the bipolar transistors 315, 317 is automatically scaled in response to the voltage $V_{out}$ of the output signal 225. As a result, overvoltage protection of the bipolar transistors 315, 317 is automatically provided, even before any calibration of the charge pump module 220 is performed.

In the example illustration of FIG. 6, the scaling of the voltage $V_e$ 610 at the common emitter node of the bipolar transistors 315, 317 with the voltage $V_{out}$ of the output signal 225 has been illustrated as being substantially linear. However, it will be appreciated that the invention is not limited to such linear scaling, and any alternative scaling profile may be implemented or utilised.

Referring back to FIG. 5, the current generator component 330 is arranged to receive a configuration signal 530 and to generate the feedback current 335 further dependent on the received configuration signal 530. Furthermore, in the illustrated example of FIG. 5, the common resistance element $R_c$ 590 of the resistance network 360 through which control current signal components 512, 522 flow consists of a configurable (e.g. switched) resistive component. Furthermore, the pulse current source 312 and trickle current source 314 may also be arranged to be configurable.

For example, and as illustrated in FIG. 5, the pulse current source 312 and trickle current source 314 are each programmable by a control signal $I_{cp\_}$code in order to enable the trickle and pulse currents to be programmed depending on a required output current strength of the charge pump circuit 310. In terms of PLL functionality, the control signal $I_{cp\_}$code allows the PLL bandwidth to be adjusted, depending on the VCO gain (or sensitivity). As the pulse current through the pulse current source 312 increases, the voltage across the pulse current source 312, and thus at the emitter of the bipolar transistor 315, will increase and thus need compensating for.

Accordingly, in the example illustrated in FIG. 5 the common resistance element $R_c$ 590 of the resistance network 360 through which control current signal components 512, 522 flow consists of a configurable (e.g. switched) resistive component configurable by the control signal $I_{cp\_}$code in order to influence the voltage across the resistance network 360, and thus at the base of the bipolar transistor 315, to compensate for voltage changes across the pulse current source 312 as a result of changes to the pulse current flowing there through. Furthermore, the current generator component 330 is arranged to receive a configuration signal 530 consisting of an inverse of the control signal $I_{cp_{13}}$ code, to generate the feedback current 335 further dependent on the received inverse of the control signal $I_{cp\_}$code 530. In this manner, the current generator component 330 is arranged to further adapt the feedback current 335 depending on the configuration of the pulse and trickle current sources in order to further compensate for voltage changes across the pulse current source 312 as a result of changes to the pulse current flowing there through.

For example, the graph of FIG. 6 shows a first example of voltage levels within the charge pump circuit 310 with respect to the output signal voltage $V_{out}$ 225, for example when the control signal $I_{cp\_}$code is set to configure low trickle and pulse currents, and thus the voltage across the pulse current source 312 is low, i.e. 0.2 V in the illustrated example. Accordingly, for the example illustrated in FIG. 6, when the voltage $V_{out}$ of the output signal 225 is at a minimum voltage level ($V_{out\_min}$) 425 of 0.4V, the feedback current $I_{f(Vout)}$ 335 is generated such that the voltage $V_e$ at the common emitter node of the bipolar transistors 315, 317, represented by the first area 610 of the graph in FIG. 6, is at a first, minimum voltage level of 0.2V, with a 0.2V collector-emitter voltage $V_{ce}$ across the first bipolar transistor 315 represented by the second area 620 of the graph in FIG. 6. Conversely, when the voltage $V_{out}$ of the output signal 225 is at a maximum voltage level ($V_{out\_max}$) 415 of 4.5V, the feedback current $I_{f(Vout)}$ 335 is generated such that the voltage $V_e$ 610 at the common emitter node of the bipolar transistors 315, 317 is at a second, maximum voltage level of 0.6V, with a 3.9V collector-emitter voltage $V_{ce}$ 620 across the first bipolar transistor 315.

Figure 7:
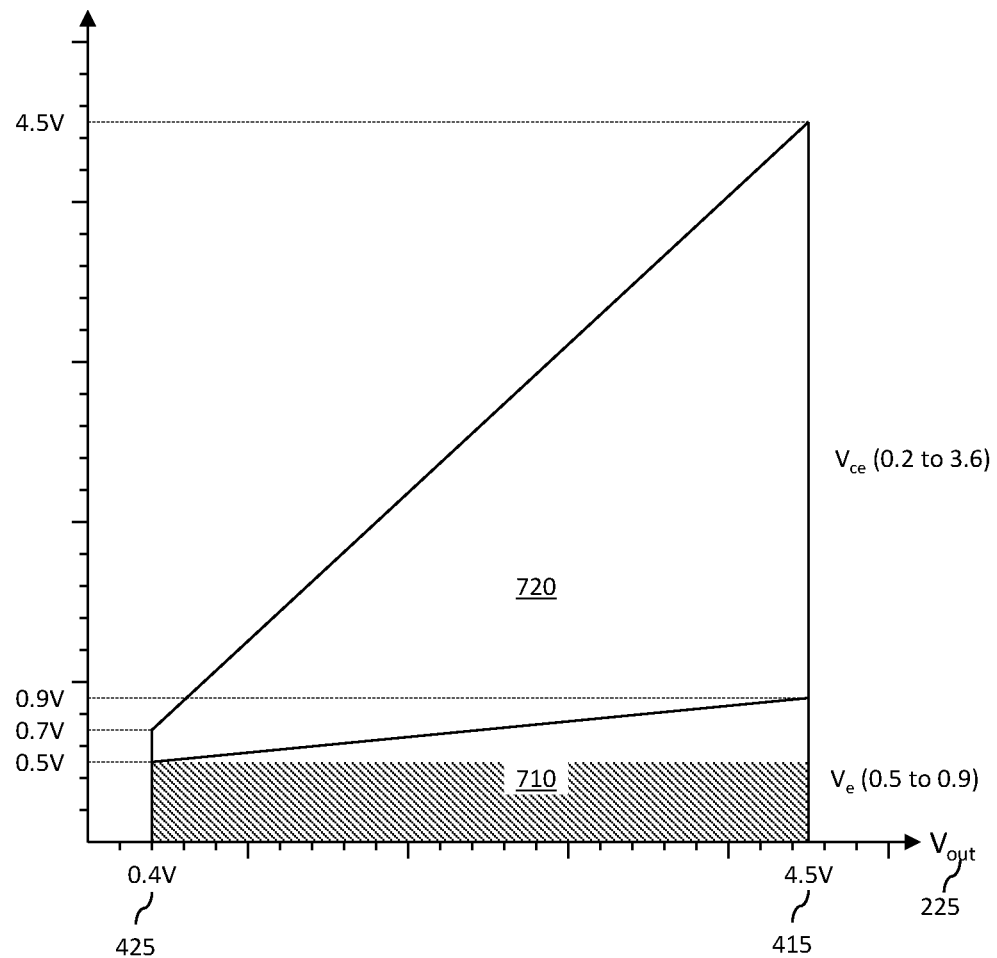
FIG. 7 illustrates a simplified flowchart of an example of a method of generating a charge pump control voltage signal.

FIG. 7 illustrates a simplified graph showing an alternative example of voltage levels within the charge pump circuit 310 with respect to the output signal voltage $V_{out}$ 225, for example when the control signal $I_{cp\_}$ code is set to configure high trickle and pulse currents, and thus the voltage across the pulse current source 312 is high, i.e. 0.5 V in the illustrated example. Accordingly, for the example illustrated in FIG. 7, when the voltage $V_{out}$ of the output signal 225 is at a minimum voltage level ($V_{out\_min}$) 425 of 0.4V, the feedback current $I_{f(Vout)}$ 335 is generated such that the voltage $V_e$ at the common emitter node of the bipolar transistors 315, 317, represented by the first area 710 of the graph in FIG. 7, is at a first, minimum voltage level of 0.5V, with a 0.2V collector-emitter voltage $V_{ce}$ across the first bipolar transistor 315 represented by the second area 720 of the graph in FIG. 7. Conversely, when the voltage $V_{out}$ of the output signal 225 is at a maximum voltage level ($V_{out\_max}$) 415 of 4.5V, the feedback current $I_{f(Vout)}$ 335 is generated such that the voltage $V_e$ 710 at the common emitter node of the bipolar transistors 315, 317 is at a second, maximum voltage level of 0.9V, with a 3.6V collector-emitter voltage $V_{ce}$ 720 across the first bipolar transistor 315.

Figure 8:
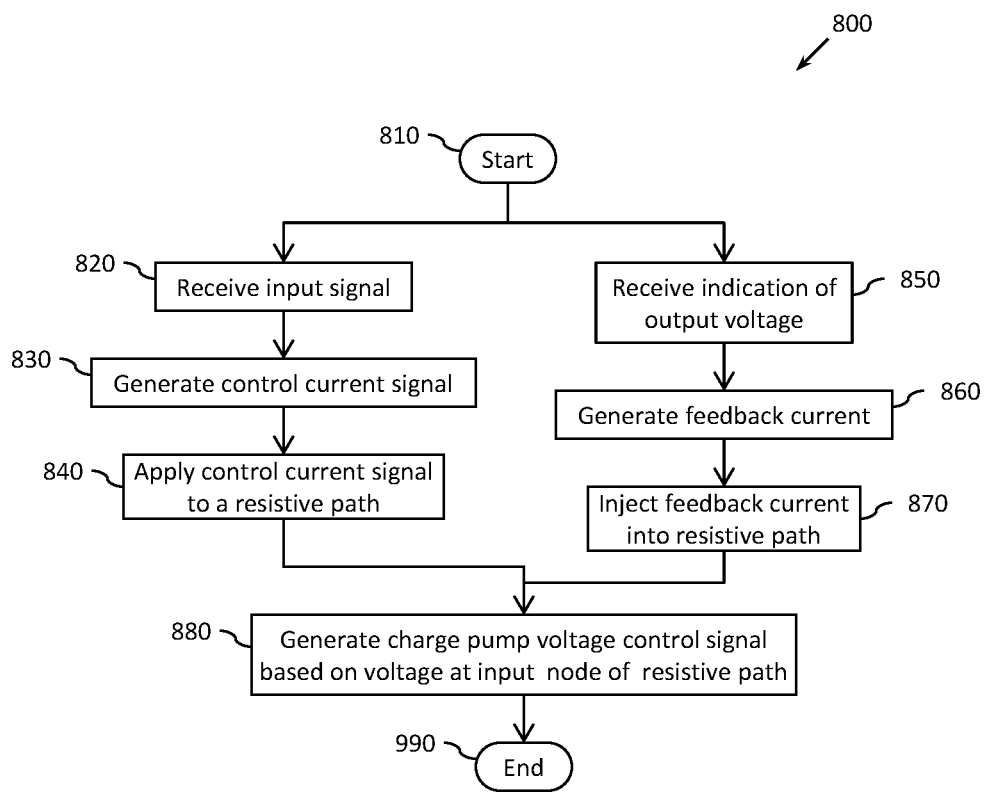

Referring now to FIG. 8, there is illustrated a simplified flowchart 800 of an example of a method of generating a charge pump control voltage signal, such as may be implemented within the charge pump module 220 illustrated in FIG. 3. The method starts at 810 and moves on to 820 where an input signal is received. A control current signal is then generated at 830 in accordance with the received input signal. The control current signal is then applied to a resistive path between an input node and a reference voltage node such that the control current signal flows through the resistive path, at 840. An indication of a voltage level of a charge pump output signal is received at 850, and a feedback current is generated at 860 dependent on the indicated voltage level of the output signal. The feedback current is then injected into the resistive path, at 870. The charge pump control voltage signal is then generated based on a voltage level at the input node at 880, the voltage level at the input node being co-dependent on the control current signal flow through the resistive path and the injected feedback current within the resistive path. The method then ends at 890.

In some examples, the method may further comprise receiving a configuration signal and generating the feedback current further dependent on the configuration signal.

The method may further comprise configuring at least one resistive component within the resistive path.

In some examples, the method may comprise generating a differential current control signal comprising a first current component and a second current component, applying the first current component of the differential current control signal to a first resistive path between a first input node and the reference voltage node, applying the second current component of the differential current control signal to a second resistive path between a second input node and the reference voltage node, injecting the feedback current into the first and second resistive paths, and generating a first charge pump control voltage signal based on a voltage level at the first input node and a second charge pump control voltage signal based on a voltage level at the second input node.

In some examples, the first and second resistive paths may share a common path section through which both the first and second current components of the differential current control signal flow, and the method may comprise injecting the feedback current into the common path section.

In some examples, the method may comprise generating the feedback current comprising a positive slope amplitude profile with respect to the voltage level of the charge pump output signal.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

Furthermore, because the illustrated embodiments of the present invention may for the most part, be implemented using electronic components and circuits known to those skilled in the art, details has not be explained in any greater extent than that considered necessary as illustrated above, for the understanding and appreciation of the underlying concepts of the present invention and in order not to obfuscate or distract from the teachings of the present invention.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms 'assert' or 'set' and 'negate' (or 'de-assert' or 'clear') are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A charge pump driver circuit arranged to output a charge pump control voltage signal; the charge pump driver circuit comprising:
   a control stage arranged to receive an input signal and to generate a control current signal in accordance with the input signal;
   an output stage arranged to receive at an input node thereof the control current signal output by the control stage, the output stage comprising a resistance network coupled between the input node thereof and a reference voltage node and arranged to provide a resistive path through which the control current signal flows, and the output stage being arranged to generate at an output node thereof the charge pump control voltage signal based on the voltage level at the input node thereof; and
   a current generator component arranged to receive an indication of a voltage level of a charge pump output signal, and to generate a feedback current dependent on the voltage level of the output signal, wherein the feedback current is injected into the resistive path of the resistance network through which the control current signal flows.

2. The charge pump driver circuit of claim 1, wherein the current generator component is arranged to receive a configuration signal and to generate the feedback current further dependent on the configuration signal.

3. The charge pump driver circuit of claim 1, wherein the resistive path of the resistance network through which the control current signal flows comprises at least one configurable resistive component.

4. The charge pump driver circuit of claim 1, wherein:
   the control stage is arranged to generate a differential current control signal comprising a first current component and a second current component;
   the output stage is arranged to receive at a first input node thereof the first current component of the differential current control signal and receive at a second input node thereof the second current component of the differential current control signal;
   the resistance network is coupled between each of the first and second input nodes and the reference voltage node and arranged to provide a first resistive path through which the first current component of the differential current control signal flows and a second resistive path through which the second current component of the differential current control signal flows;
   the output stage is arranged to generate a first charge pump control voltage signal at a first output node thereof based on the voltage level at the first input node and a second charge pump control voltage signal at a second output node thereof based on the voltage level at the second input node; and
   the feedback current generated by the current generator component is injected into the first and second resistive paths of the resistance network through which the first and second current components of the differential current control signal flow.

5. The charge pump driver circuit of claim 4, wherein the first and second resistive paths share a common path section through which both the first and second current components of the differential current control signal flow, and the feedback current is injected into the common path section.

6. The charge pump driver circuit of claim 1, wherein the current generator component is arranged to generate the feedback current comprising a positive slope amplitude profile with respect to the voltage level of the charge pump output signal.

7. A phase-locked loop, PLL, comprising a charge pump driver circuit according to claim 1.

8. A method of generating a charge pump control voltage signal; the method comprising:
   receiving an input signal and generating a control current signal n accordance with the input signal;
   apply the reference current to a resistive path between an input node and a reference voltage node;
   receiving an indication of a voltage level of a charge pump output signal and generating a feedback current dependent on the indicated voltage level of the output signal;
   injecting the feedback current into the resistive path; and generating the charge pump control voltage signal based on a voltage level at the input node.

9. The method of claim 8 further comprising receiving a configuration signal and generating the feedback current further dependent on the configuration signal.

10. The method of claim 8 further comprising configuring at least one resistive component within the resistive path.

11. The method of claim 8, wherein the method comprises:
  generating a differential current control signal comprising a first current component and a second current component;
  applying the first current component of the differential current control signal to a first resistive path between a first input node and the reference voltage node;
  applying the second current component of the differential current control signal to a second resistive path between a second input node and the reference voltage node;
  injecting the feedback current into the first and second resistive paths; and
  generating a first charge pump control voltage signal based on a voltage level at the first input node and a second charge pump control voltage signal based on a voltage level at the second input node.

12. The method of claim 11, wherein the first and second resistive paths share a common path section through which both the first and second current components of the differential current control signal flow, and the method comprises injecting the feedback current into the common path section.

13. The method of claim 8, wherein the method comprises generating the feedback current comprising a positive slope amplitude profile with respect to the voltage level of the charge pump output signal.

14. A phase-locked loop (PLL) comprising a charge pump driver circuit arranged to output a charge pump control voltage signal; the charge pump driver circuit comprising:
  a control stage arranged to receive an input signal and to generate a control current signal in accordance with the input signal;
  an output stage arranged to receive at an input node thereof the control current signal output by the control stage, the output stage comprising a resistance network coupled between the input node thereof and a reference voltage node and arranged to provide a resistive path through which the control current signal flows, and the output stage being arranged to generate at an output node thereof the charge pump control voltage signal based on the voltage level at the input node thereof; and
  a current generator component arranged to receive an indication of a voltage level of a charge pump output signal, and to generate a feedback current dependent on the voltage level of the output signal, wherein the feedback current is injected into the resistive path of the resistance network through which the control current signal flows.

15. The PLL of claim 14, wherein the current generator component is arranged to receive a configuration signal and to generate the feedback current further dependent on the configuration signal.

16. The PLL of claim 14, wherein the resistive path of the resistance network through which the control current signal flows comprises at least one configurable resistive component.

17. The PLL of claim 14, wherein:
  the control stage is arranged to generate a differential current control signal comprising a first current component and a second current component;
  the output stage is arranged to receive at a first input node thereof the first current component of the differential current control signal and receive at a second input node thereof the second current component of the differential current control signal;
  the resistance network is coupled between each of the first and second input nodes and the reference voltage node and arranged to provide a first resistive path through which the first current component of the differential current control signal flows and a second resistive path through which the second current component of the differential current control signal flows;
  the output stage is arranged to generate a first charge pump control voltage signal at a first output node thereof based on the voltage level at the first input node and a second charge pump control voltage signal at a second output node thereof based on the voltage level at the second input node; and
  the feedback current generated by the current generator component is injected into the first and second resistive paths of the resistance network through which the first and second current components of the differential current control signal flow.

18. The PLL of claim 17, wherein the first and second resistive paths share a common path section through which both the first and second current components of the differential current control signal flow, and the feedback current is injected into the common path section.

19. The PLL of claim 14, wherein the current generator component is arranged to generate the feedback current comprising a positive slope amplitude profile with respect to the voltage level of the charge pump output signal.

\* \* \* \* \*